United States Patent [19]
Powell

[11] Patent Number: 5,248,385
[45] Date of Patent: Sep. 28, 1993

[54] PROCESS FOR THE HOMOEPITAXIAL GROWTH OF SINGLE-CRYSTAL SILICON CARBIDE FILMS ON SILICON CARBIDE WAFERS

[75] Inventor: J. Anthony Powell, North Olmsted, Ohio

[73] Assignee: The United States of America, as represented by the Administrator, National Aeronautics and Space Administration, Washington, D.C.

[21] Appl. No.: 718,314

[22] Filed: Jun. 12, 1991

[51] Int. Cl.⁵ ................... H01L 21/306; H01L 21/20
[52] U.S. Cl. ........................................ 156/645; 148/33; 148/DIG. 148; 156/646; 156/662; 156/612; 156/DIG. 64; 252/79.1; 423/346; 427/249; 427/309; 437/100
[58] Field of Search .............. 156/636, 645, 646, 657, 156/662, 610–614, DIG. 64; 252/79.1, 79.2; 437/100, 105; 427/38, 309, 249; 148/33, 33.1, DIG. 148; 428/627, 446; 423/345–347

[56] References Cited

U.S. PATENT DOCUMENTS

| | | | |
|---|---|---|---|
| 3,275,415 | 9/1966 | Chang et al. | 23/208 |
| 3,520,740 | 7/1970 | Addamiano | 148/175 |
| 4,664,944 | 5/1987 | Hsu et al. | 427/87 |
| 4,866,005 | 9/1989 | Davis et al. | 437/100 |
| 4,912,063 | 3/1990 | Davis et al. | 437/100 |
| 4,912,064 | 3/1990 | Kong et al. | 437/100 |
| 4,946,547 | 8/1990 | Palmour et al. | 156/643 |

OTHER PUBLICATIONS

Jennings, V. J. et al., "The Expitaxial Growth of Silicon Carbide," Journal of the Electrochemical Society, vol. 113, No. 7, Jul., 1966, pp. 728–731.

*Primary Examiner*—William A. Powell
*Attorney, Agent, or Firm*—James A. Mackin; Gene E. Shook; Guy M. Miller

[57] ABSTRACT

The invention is a method for growing homoepitaxial films of SiC on low-tilt-angle vicinal (0001) SiC wafers. The invention proposes and teaches a new theoretical model for the homoepitaxial growth of SiC films on (0001) SiC substrates. The inventive method consists of (1) preparing the growth surface of SiC wafers slightly off-axis (from less than 0.1° to 6°) from the (0001) plane, (2) subjecting the growth surface to a suitable etch, and then (3) growing the homoepitaxial film using conventional SiC growth techniques.

18 Claims, 2 Drawing Sheets

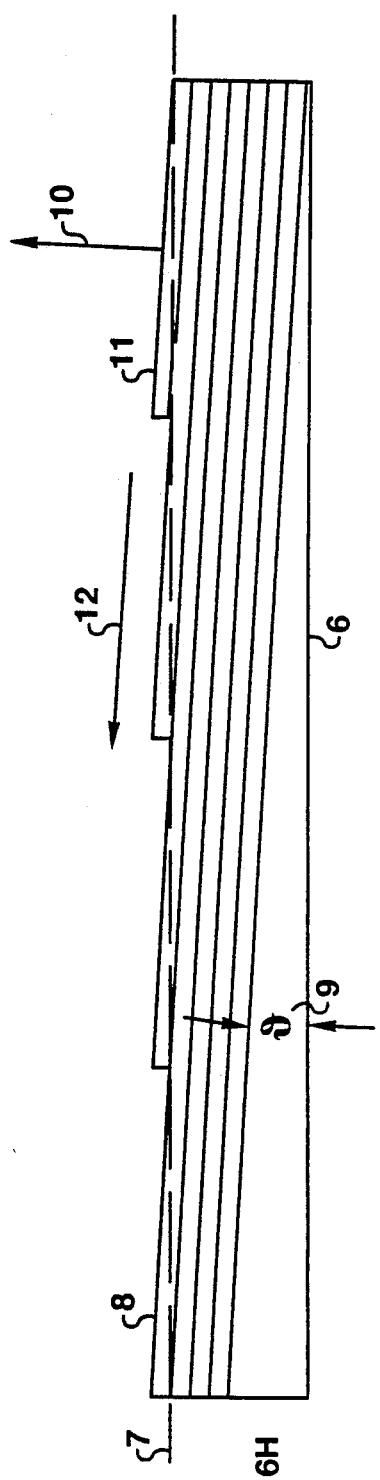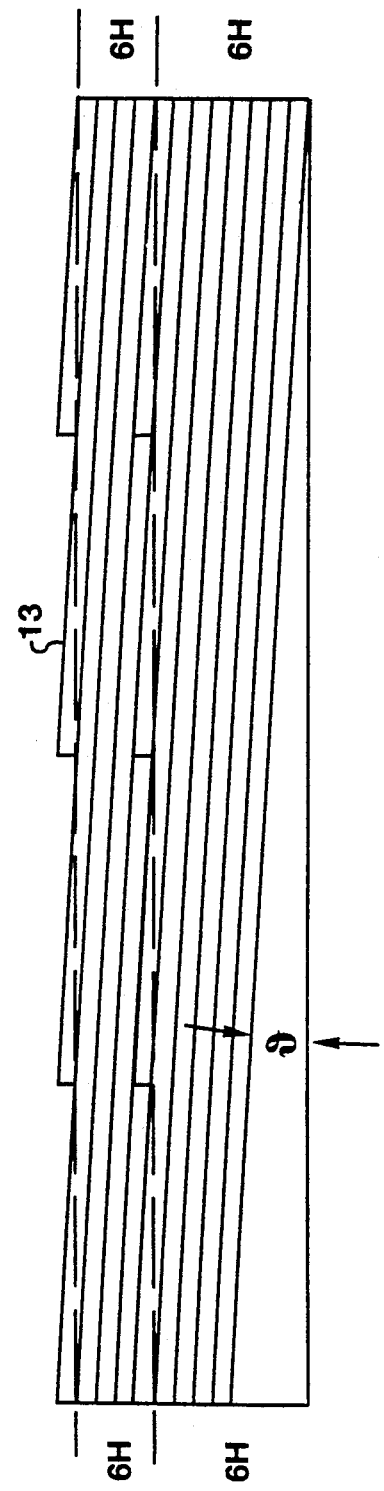
Fig. 2a
Fig. 2b

PROCESS FOR THE HOMOEPITAXIAL GROWTH OF SINGLE-CRYSTAL SILICON CARBIDE FILMS ON SILICON CARBIDE WAFERS

ORIGIN OF THE INVENTION

This invention was made by an employee of the United States Government and may be made or used by the Government of the United States without a payment of royalties thereon or therefore.

TECHNICAL FIELD OF THE INVENTION

This invention relates to the homoepitaxial growth of single-crystal semiconductor-device-quality films of SiC on SiC wafers. More specifically, it relates to a new process for growing, by chemical vapor deposition (CVD), a single-crystal low-defect-density film of 6H-SiC on a low-tilt-angle (less than 1°) vicinal (0001) 6H-SiC wafer at relatively low temperatures (approximately 1450° C.).

BACKGROUND OF THE INVENTION

Silicon carbide possesses properties that should make it a superior semiconductor for applications that involve high temperature, high power, high radiation and/or high frequency (See *Amorphous and Crystalline Silicon Carbide* and *Amorphous and Crystalline Silicon Carbide II*). In addition, a variety of optical devices (e.g. light-emitting diodes, LEDs) can be fabricated from SiC and operated at high temperature. The properties that allow this superior performance are its large bandgap, excellent physical stability, high thermal conductivity, high electric breakdown field, and high saturated electron drift velocity. Semiconductor devices fabricated from SiC are capable of operating at temperatures above 600° C., which is well above the capability of current commercial semiconductors. Also, based on theoretical considerations, SiC microwave devices should be far superior to currently available devices. The potential market for SiC devices is very large and could exceed billions of dollars annually.

The chief obstacle to the commercialization of SiC has been the lack of control over its crystal growth. Several properties of SiC contribute to this lack of control. First, it does not melt at reasonable pressures; it sublimes at temperatures above 1800° C. Second, it grows in many different crystal structures, called polytypes. The following defines some of the nomenclature used in this document. The SiC polytypes are formed by the stacking of double layers of Si and C atoms. Each double layer may be situated in one of three positions, designated as A, B, and C. The sequence of stacking determines the particular polytype and the stacking direction is called the crystal c-axis. There is one cubic polytype, with the zincblende structure and known as 3C or β SiC. It has a three-layer repeat sequence ABC . . . , and so forth. All of the other polytypes are known as α-SiC and have either a hexagonal or rhombohedral structure. The hexagonal 6H-SiC polytype has the six layer repeat sequence ABCACB . . . , and so forth. For the α-SiC polytypes, the (0001) plane is known as the basal plane, and this plane is perpendicular to the c-axis. The (111) plane of 3C-SiC is equivalent to the basal plane of the α-SiC polytypes. In the discussions of this document, "basal plane" shall refer to either the (0001) plane for α-SiC, or the (111) plane of 3C-SiC. Also, "3C" shall be used for 3C-SiC, and "6H" shall be used for 6H-SiC. It is well known that a SiC surface, which is approximately parallel to the basal plane, is terminated with either Si atoms (the surface called the Si face) or terminated with C atoms (the surface called the C face). The term "vicinal (0001) wafer" shall refer to SiC wafers whose polished surface is misoriented less than 6° from the basal plane. The term "homoepitaxial" shall refer to epitaxial growth whereby the film and the substrate (wafer) are of the same polytype, and the term "heteroepitaxial" shall refer to growth whereby the film is of a different polytype than the substrate.

Since melt-growth techniques cannot be applied to SiC, vapor growth processes have been developed. An early SiC vapor-growth process, the Lely process (J. A. Lely, Ber. Dt. Keram. Ges. 32, 229 (1955)), was based on the sublimation of polycrystalline SiC within a growth cavity and did produce rather pure crystals of various polytypes. Unfortunately, the crystals were too small, irregular in shape, and thus not suitable for commercial development. More recently, a high temperature sublimation process has been developed that does produce large single-crystal boules of 6H. Furthermore, polished wafers, more than 25 mm in diameter, can be produced from these boules. Commercial 6H-SiC devices are now being produced with these wafers.

In order to fabricate semiconductor devices, it is necessary to be able to grow high-quality, low-defect-density, single-crystal films on single-crystal wafers. A variety of processes have been developed to produce homoepitaxial SiC films at relatively high temperatures (above 1600° C.). It is well known that single-crystal homoepitaxial 6H films can be grown in the lower temperature range 1400° C. to 1550° C. by chemical vapor deposition (CVD) on vicinal (0001) 6H wafers if the tilt angle is greater than about 1.5°. Typically 3° to 4° is used. Large tilt angles can cause problems. Since α-SiC has anisotropic properties, CVD films, grown on vicinal (0001) substrates with non-zero tilt angles, will have anisotropic properties parallel to the growth surface. The larger the tilt angle, the larger will be the anisotropy. This could result in unwanted behavior in devices fabricated with the CVD films. From this viewpoint, small tilt angles are desirable.

If the tilt angle of a vicinal (0001) 6H-SiC substrates is less than about 1°, a 3C heteroepitaxial film will be produced on the 6H wafer if prior art processes are used. However, the 3C film grown in this way generally has a high density of defects, including a defect known as double positioning boundaries (DPBs). This DPB defect can arise because of the change in stacking sequence of the 6H wafer (i.e. ABCACB . . .) to that of the 3C (ABC. . . or ACB. . .) film at the interface between the two polytypes. The difference between the two 3C sequences is a 60° rotation about the <111> axis. If both of these sequences nucleate on the 6H substrate, DPBs will form at the boundary between domains differing by the 60°.

A theoretical crystal growth model, proposed by Matsunami and which has been used to explain the formation of the 3C and 6H polytypes on vicinal (0001) 6H substrates, is based on the density of atomic-scale steps on the growth surface. According to this model, 6H grows on 6H when the tilt angle is greater than about 1.5° because terraces between steps are small and arriving molecules containing Si and C are able to migrate to steps where growth occurs. This growth is a lateral growth of the steps and reproduces the 6H substrate. For small tilt angles, say less than 1°, the terraces are larger and all molecules are not able to migrate to steps; instead, nucleation of 3C takes place on the terraces. Hence, for small tilt angles, 3C grows on 6H substrates. Thus, for the case of growth on low-tilt-angle (less than 1°) polished 6H wafers, prior art teaches that a 3C film is inevitable.

In the CVD growth of epitaxial SiC films on vicinal (0001) α-SiC wafers, a variety of pregrowth process have been used to prepare the polished surface for growth. The intent of these processes is to remove contamination and near-surface defects (from cutting and polishing the wafer) that contribute to poor quality films. Processes used to eliminate near-surface defects include molten-salt etching, oxidation followed by removal of the oxide with hydrofluoric acid, reactive ion etching, etc. prior to loading wafers into the CVD growth system. In situ processes (within the CVD growth system) include high temperature etching in $H_2$ or $HCl/H_2$ mixtures. All prior art use of these processes in CVD at temperatures less than 1600° C. has produced the heteroepitaxial growth of 3C on vicinal (0001) 6H if the tilt angle was less than 1°. In one case, Powell et al. used an HCl etch consisting of 2 min at 1200° C. In another case, Matsunami et al. used an HCl etch consisting of 10 min at 1500° C. In both of these cases, 3C films were produced on vicinal (0001) 6H with tilt angles of less than 1°. It must be emphasized at this point that prior-art teaches that pregrowth surface treatments of substrates used in CVD processes, can be effective in reducing defects in the resulting film. Prior art has not taught that surface treatments can be a significant factor in controlling the polytype of CVD-grown SiC films.

SUMMARY OF THE INVENTION

The present invention proposes and teaches a new theoretical model for the growth of SiC on low-tilt-angle vicinal (0001) SiC substrates. Basically, the model teaches that at the temperatures normally used in the growth of SiC films (greater than about 1300° C.), the step density (and hence, the tilt angle) is not a major factor in the heterogeneous nucleation of a polytype different from the substrate. Instead, arriving molecules containing Si and C do migrate easily to steps on the surface where lateral growth of the steps takes place. This is homoepitaxial growth since the film and wafer are of the same polytype. Heterogeneous nucleation (i.e., a different polytype is nucleated) can take place at sites where there is contamination, or defects, or some other form of surface disturbance. These sites can be either intentional or non-intentional.

In summary, the inventive method is comprised of three essential steps. The first step consists of cutting and polishing a SiC wafer such that the polished surface of the wafer is slightly misoriented (from near 0° to about 6°) from the SiC basal plane. The second step consists of subjecting the polished surface of the SiC wafer to a suitable pregrowth etch (e.g. a suitable high temperature etch in an $HCl/H_2$ mixture) that will remove all contamination, defects, or surface disturbances, that could act as sites for heterogeneous nucleation of a different SiC polytype. At the same time, this pregrowth etch should not alter the wafer surface in a manner that would impede subsequent lateral growth from atomic steps on the wafer surface. It must be emphasized that the primary intent of the pregrowth etch is to cause homoepitaxial growth rather than heteroepitaxial growth. A secondary intent is to improve the quality of the homoepitaxially grown film. The third step consists of growing a SiC film by any suitable means; because sites for heterogeneous nucleation have been eliminated, only homogeneous growth will take place at the atomic-scale steps on the surface. The homoepitaxial film can be grown to the desired thickness. Conventional SiC processes can be used to fabricate desired SiC device structures within the epitaxial film.

In view of the foregoing, it is an object of the present invention to provide an improved method for the homoepitaxial growth of low-defect-density single-crystal SiC films on vicinal (0001) α-SiC (or vicinal (111) 3C-SiC) wafers with non-zero tilt angles.

It is another object of the present invention to provide a new method for the homoepitaxial growth of low-defect-density single-crystal SiC films on low-tilt-angle (non-zero, but less than 1°) vicinal (0001) α-SiC (or vicinal (111) 3C-SiC) wafers.

It is another object of the invention to provide a method of growing low-defect single-crystal 6H films on low-tilt-angle vicinal (0001) 6H wafers.

The foregoing and other objects, advantages and features of the invention, and the manner in which same are accomplished, will become more readily apparent upon the following summary and detailed description of the invention.

DESCRIPTION OF THE DRAWINGS

FIG. 2a is a cross-sectional schematic drawing illustrating atomic-scale growth steps on a wafer surface utilized in the process of the invention.

FIG. 2b is a cross-sectional schematic drawing illustrating the growth of a SiC film on the wafer shown in FIG. 2a.

DETAILED DESCRIPTION OF A PREFERRED EMBODIMENT

Figure 1:
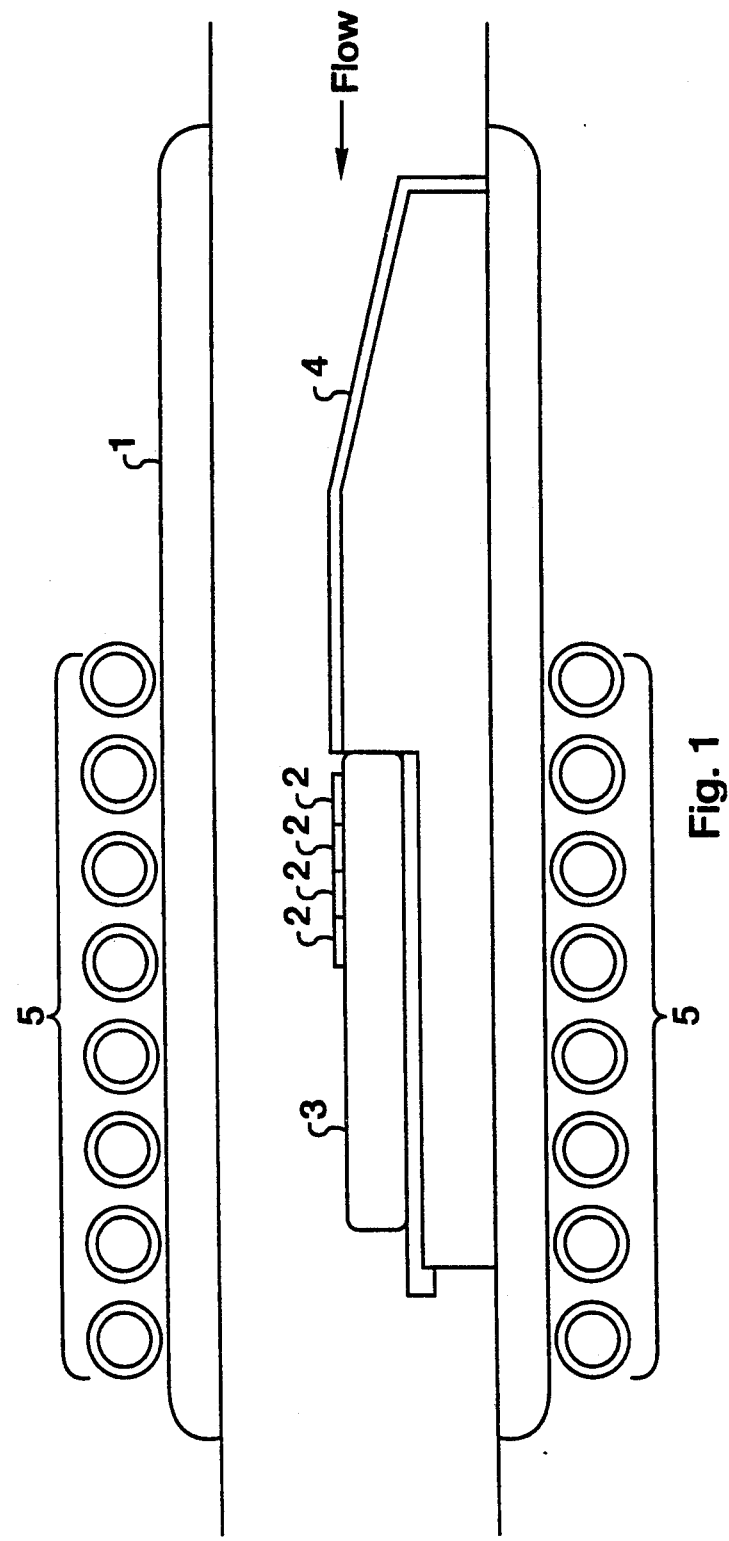
FIG. 1 is a schematic drawing of reaction chamber utilized in the process of the invention.

The process of the invention can be carried out with a conventional chemical vapor deposition (CVD) system similar to that used in silicon semiconductor technology and familiar to those skilled in the art of semiconductor device fabrication. Process gases commonly used in conventional silicon CVD technology are $H_2$ (used as a carrier gas), $SiH_4$ (used as a source of silicon), HCl (used for cleaning and etching the wafer surface), and various gases used for doping the resulting epitaxial film. For the preferred embodiment, the process of the invention uses $H_2$, $SiH_4$, and HCl. In addition, the process of the invention uses $C_3H_8$ as a source of carbon, nitrogen as an n-type dopant, and trimethylaluminum (TMA) as a p-type dopant. Any CVD system that can deliver these gases to a suitable reaction chamber at the proper flowrates under high purity conditions can be used for the inventive process.

Referring now to FIG. 1, there is shown a schematic, partial view of a suitable reaction chamber 1 for carrying out the process of the invention. Chamber 1 is comprised of a double-walled quartz tube such that the inner quartz tube can be water-cooled. Silicon carbide substrates 2 are supported by a SiC-coated graphite susceptor 3 which in turn is supported by quartz support 4. To produce the desired temperature at the SiC substrates, a radio frequency (RF) induction coil 5 is disposed around chamber 1. The RF field produced by coil 5 heats the susceptor to the desired temperature.

The inventive method comprises a sequence of steps. As an example of a preferred embodiment, the chemical vapor deposition of a 6H film on a low-tilt-angle (0.2°) vicinal (0001) 6H wafer will be described.

Referring now to FIG. 2, there is shown an atomic-scale cross-sectional drawing of a SiC substrate 6 prepared for the inventive process. The preparation procedure is the first step of the inventive process and is as follows. The wafer is sliced from a 6H boule such that the wafer surface 7 is misoriented relative to the basal plane 8 by a tilt angle 9 of approximately 0.2°. The c-axis 10 is perpendicular to the basal plane. Also, the non-zero tilt angle produces atomic steps 11 on the wafer surface. Although a tilt direction toward <1100> or <1120> can be used, it is expected that further work will determine which direction is the optimum. The wafer is then polished on one face with diamond paste using conventional polishing techniques. Either the Si face or the C face can be polished for growth and used for the preferred embodiment. The choice is determined by the intended use of the SiC film to be grown.

The second step of the inventive process comprises subjecting the SiC wafer to a pregrowth treatment that will remove all contamination, defects, or other surface disturbances that could act as sites for the heterogeneous nucleation of SiC polytypes different from the wafer itself. Such defects can be generated in cutting and polishing the wafer. An important requirement of this second step is that the pregrowth treatment itself not alter the surface in a way that (1) sites for heterogeneous nucleation are introduced or (2) lateral growth from atomic steps on the surface is prevented. In the preferred embodiment, the wafer is subjected to a high temperature gaseous etch in a mixture of HCl and $H_2$ in the reaction chamber shown in FIG. 1. The chamber is a conventional horizontal water-cooled quartz chamber with an inside diameter of 50 mm and which can be used for processing up to temperatures that are required for growth (in this case, about 1450° C.). The SiC wafer is supported and heated by a SiC-coated r.f. heated graphite susceptor. A suitable combination of time, temperature, and HCl concentration are required for this etching step. Typical conditions for a suitable etch are 25 minutes at 1350° C. with about 3% HCl in the $H_2$ carrier gas with a flow of about 3 l/min. The maximum concentration of HCl is limited since above an HCl concentration of about 4% etch pits will be generated in the surface of the wafer. If an HCl concentration lower than about 2% is used, the resulting 6H film will have an undesirable hillock morphology. Lower temperatures (e.g. 1200° C.) will not eliminate heterogeneous nucleation sites. Higher temperatures (e.g. 1500° C.) etches too rapidly around the periphery of wafers and introduces many heterogeneous nucleation sites. The exact values of these HCl etching parameters are dependent on the growth system. The result of varying the parameters (e.g. temperature and concentration) are given as a guide to the underlying principle behind this invention. To those skilled in the art, a combination of pregrowth treatments, such as oxidation, reactive ion etching, and the $H_2$/HCl treatment may also be developed to remove potential sites of unwanted heterogeneous nucleation.

The third and final step of the inventive process comprises growing a SiC film on the SiC wafer by some suitable means. The inventive method teaches that a suitable means will produce a lateral growth of the atomic steps 11 in a direction parallel to the basal plane 8. Referring now to FIG. 2a, the growth direction 12 is indicated. In the preferred embodiment, films were produced by a suitable CVD process. Referring now to FIG. 2b, the SiC homoepitaxial film 13 is indicated. Conditions for CVD growth were as follows. Silane and propane were used as precursors for the Si and C. With a carrier $H_2$ gas flow of 3 l/min at atmospheric pressure, the wafer temperature was increased to the growth temperature of 1450° C. After waiting for about 30 seconds for approximate temperature and flow equilibrium to be reached, silane and propane were added to the carrier gas to initiate SiC growth. With silane and propane concentrations of 300 and 120 ppm in the carrier gas, a vertical film growth rate of about 4 micrometers per hour was achieved.

The inventive method can be applied to the fabrication of semiconductor devices of many kinds. Conventional doping techniques for SiC, such as (1) in situ doping during growth, or (2) ion implantation, can be applied in the fabrication of SiC devices. Other conventional SiC device fabrication processes (e.g. oxidation, reactive ion etching, metallization, etc.) can be used in the fabrication of devices. To those skilled in the art of semiconductor device fabrication, the present inventive method has many applications. Possible devices include (but are not limited to) 6H devices fabricated on low-tilt-angle (less than 1°) vicinal (0001) 6H wafers.

Many modifications of the inventive method are possible. For example, the inventive process could be carried out in a vertical barrel-type CVD system or in an ultra high vacuum system (e.g. a molecular beam epitaxial (MBE) system).

While the present invention has been described by reference to preferred embodiments and preferred process parameters, it will be appreciated that modifications may be made without departing from the true spirit and scope of the invention.

That which is claimed is:

1. A method of producing a device quality silicon carbide film on a silicon carbide substrate of the same polytype comprising: homoepitaxially depositing a film of a SiC polytype on a specially prepared planar surface of a SiC substrate, wherein the planar surface can have any non-zero inclination relative to a basal plane from less than 0.1° to about 6° and wherein the planar surface has been subjected to a suitable pregrowth etch that eliminates all surface features that can act as sites of heterogeneous nucleation of a polytype different from the substrate during subsequent film growth.

2. A method according to claim 1 wherein the polytype of both the substrate and the film is 6H-SiC.

3. A method according to claim 1 wherein the suitable pregrowth etch consists of heating the planar substrate in an HCl/$H_2$ mixture to a temperature of between 1300° C. and 1450° C.

4. A method according to claim 1 wherein the temperature of the etch is between 1300° C. and 1450° C., the time of the etch is between 2 min and 60 min, and the HCl concentration is between 2% and 5%.

5. A method according to claim 1 wherein the temperature of the etch is between 1350° C. and 1400° C., the time of the etch is between 10 min and 30 min, and the HCl concentration is between 3% and 4%.

6. A method according to claim 1 wherein the temperature of the etch is about 1350° C., the time of the etch is between 20 min and 30 min, and the HCl concentration is between 3% and 4%.

7. A method according to claim 1 wherein the substrate is a wafer cut from a single-crystal SiC boule.

8. A method according to claim 1 wherein the planar surface of the substrate is prepared by polishing said surface.

9. A method according to claim 1 wherein including the step of fabricating one or more electronic devices on the film.

10. A method of producing a single-crystal SiC film homoepitaxially deposited on a single-crystal SiC substrate, wherein the film is characterized by a smooth surface morphology, substantially uniform thickness, and a low, device-quality defect level, said method comprising:

lapping and polishing a SiC substrate crystal to expose a planar surface that is inclined in any direction by any non-zero angle in the range from less than 0.1° to about 6° with respect to a basal plane;

subjecting the planar surface of the substrate to a pregrowth etch in an HCl/H$_2$ mixture at a temperature in the range 1300° to 1450° C.;

heating the substrate in a growth chamber;

introducing a carrier gas, a vaporized silicon-containing material and a vaporized carbon-containing material into the growth chamber while providing sufficient energy to create surface diffusion of silicon and carbon species at the substrate planar surface and establish a homoepitaxial growth of single-crystal SiC; and maintaining the carrier gas, silicon-containing material and carbon containing material flows and the energy levels for a time sufficient to grow a film of desired thickness.

11. A method according to claim 10 wherein the temperature of the etch is between 1300° C. and 1450° C., the time of the etch is between 2 min and 60 min, and the HCl concentration is between 2% and 5%.

12. A method according to claim 10 wherein the temperature of the etch is between 1350° C. and 1400° C., the time of the etch is between 10 min and 30 min, and the HCl concentration is between 3% and 4%.

13. A method according to claim 10 wherein the temperature of the etch is about 1350° C., the time of the etch is 25 min, and the HCl concentration is between 3% and 4%.

14. A method according to claim 10 wherein the growth temperature is maintained at a temperature on the order of about 1350° C. to 1700° C.

15. A method according to claim wherein the carrier gas is H$_2$.

16. A method according to claim 10 wherein the carrier gas is H$_2$, the Vaporized silicon-containing material is a SiH$_4$ source gas and the vaporized carbon-containing material is a C$_3$H$_8$ source gas.

17. A method according to claim 10 including the step of introducing dopants into the growth chamber during epitaxial growth of the single-crystal SiC.

18. The product produced by method of claim 1.

* * * * *